(12) United States Patent
Wu et al.

(10) Patent No.: US 6,444,572 B2
(45) Date of Patent: *Sep. 3, 2002

(54) SEMICONDUCTOR PROCESSING METHODS OF FORMING A CONTACT OPENING

(75) Inventors: Zhiqiang Wu, Meridian; Alan R. Reinberg; Manny Ma, both of Boise, all of ID (US)

(73) Assignee: Micron Technology Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/862,229

(22) Filed: May 21, 2001

Related U.S. Application Data

(63) Continuation of application No. 09/283,735, filed on Apr. 1, 1999, now Pat. No. 6,274,482, which is a continuation of application No. 08/807,192, filed on Feb. 27, 1997, now Pat. No. 5,985,766.

(51) Int. Cl.$^7$ .............................................. H01L 21/302
(52) U.S. Cl. ..................... 438/637; 438/669; 438/700; 438/720; 438/742; 438/736; 430/314
(58) Field of Search ..................... 216/18, 19; 438/625, 438/637, 669, 700, 720, 734, 736, 738, 742, 946, 950; 430/312, 314, 316

(56) References Cited

U.S. PATENT DOCUMENTS

| | | | |
|---|---|---|---|
| 3,649,393 A | | 3/1972 | Hatzakis |
| 4,184,909 A | | 1/1980 | Chang et al. |
| 4,374,869 A | * | 2/1983 | Dorey, II et al. ........... 118/505 |

U.S. PATENT DOCUMENTS

FOREIGN PATENT DOCUMENTS

| | | |
|---|---|---|
| JP | 401181532 A | 7/1989 |
| JP | 404180223 A | 6/1992 |

OTHER PUBLICATIONS

Tue Nguyen, et al. "A Novel Damascene Process for One Mask Via/Interconnect Formation" 1996 Symposium on VLSI Technology Digest of Technical Papers, p. 118–119, 1996 IEEE.

Primary Examiner—Randy Gulakowski
Assistant Examiner—J Smetana
(74) Attorney, Agent, or Firm—Wells St. John P.S.

(57) ABSTRACT

The invention provides methods for forming contact openings to a substrate location with which electrical connection is desired. According to one aspect, a multi-level layer comprising masking material or photoresist is formed atop an electrically conductive substrate surface and defines a mask opening through which a contact opening is to be formed to an elevationally lower substrate location. A single layer of photoresist is patterned to form an elevationally thicker first layer immediately laterally adjacent the mask opening than a second layer which is formed laterally outward of the first layer. The electrically conductive substrate surface is etched through the mask opening to form the contact opening. The photoresist second layer is removed and the conductive substrate surface is etched to form a portion of an outer conductive component. Thereafter, conductive material is formed in the contact opening to electrically connect elevationally separated layers. According to another aspect, a masking material layer comprises a bi-level profile having two different layer elevational thicknesses, the greater of which being disposed immediately laterally adjacent a contact opening pattern. A contact opening is etched through the substrate outer surface and conductive material is formed therein to electrically connect the substrate location with an outer conductive layer. In a preferred implementation, the masking material layer or photoresist is formed through photolithography using only a single mask. In another implementation, more than one mask is used to define the multi-level or bi-level profile masking material layer. The multi-level masking layer can have more than two levels.

10 Claims, 4 Drawing Sheets

U.S. PATENT DOCUMENTS

| | | | |
|---|---|---|---|
| 4,405,709 A | * 9/1983 | Katano et al. | 101/401.1 |
| 4,591,547 A | 5/1986 | Brownell | |
| 4,826,754 A | 5/1989 | Bobbio | |
| 5,112,440 A | * 5/1992 | Banks et al. | 216/106 |
| 5,213,916 A | 5/1993 | Cronin et al. | |
| 5,573,962 A | 11/1996 | Sung | |
| 5,632,908 A | 5/1997 | Shahid | |
| 5,635,337 A | 6/1997 | Bartha et al. | |
| 5,681,774 A | 10/1997 | Tseng | |
| 5,702,568 A | 12/1997 | Shin et al. | |
| 5,738,757 A | 4/1998 | Burns et al. | |
| 5,741,624 A | 4/1998 | Jeng et al. | |
| 5,753,417 A | 5/1998 | Ulrich | |
| 5,882,535 A | * 3/1999 | Stocks et al. | 216/18 |
| 5,935,454 A | 8/1999 | Tada et al. | |
| 5,942,802 A | 8/1999 | Aoi | |
| 5,972,788 A | 10/1999 | Ryan et al. | |
| 6,022,804 A | 2/2000 | Yano et al. | |
| 6,042,999 A | 3/2000 | Lin et al. | |
| 6,080,661 A | 6/2000 | Bothra | |

* cited by examiner

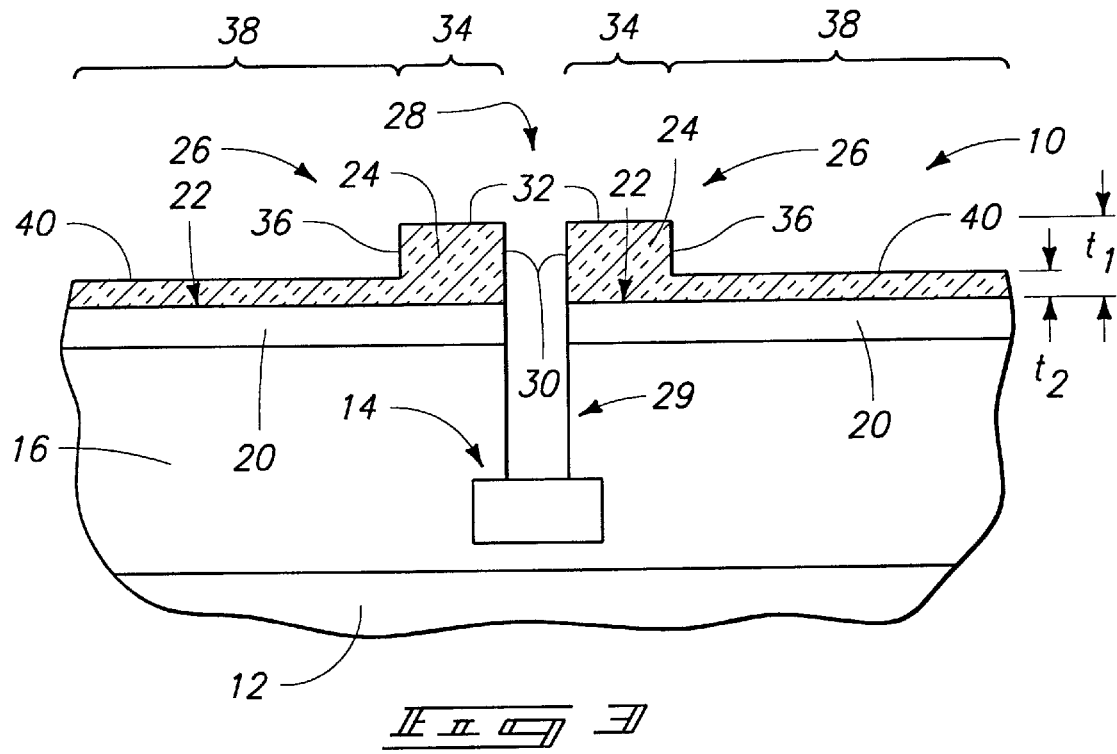
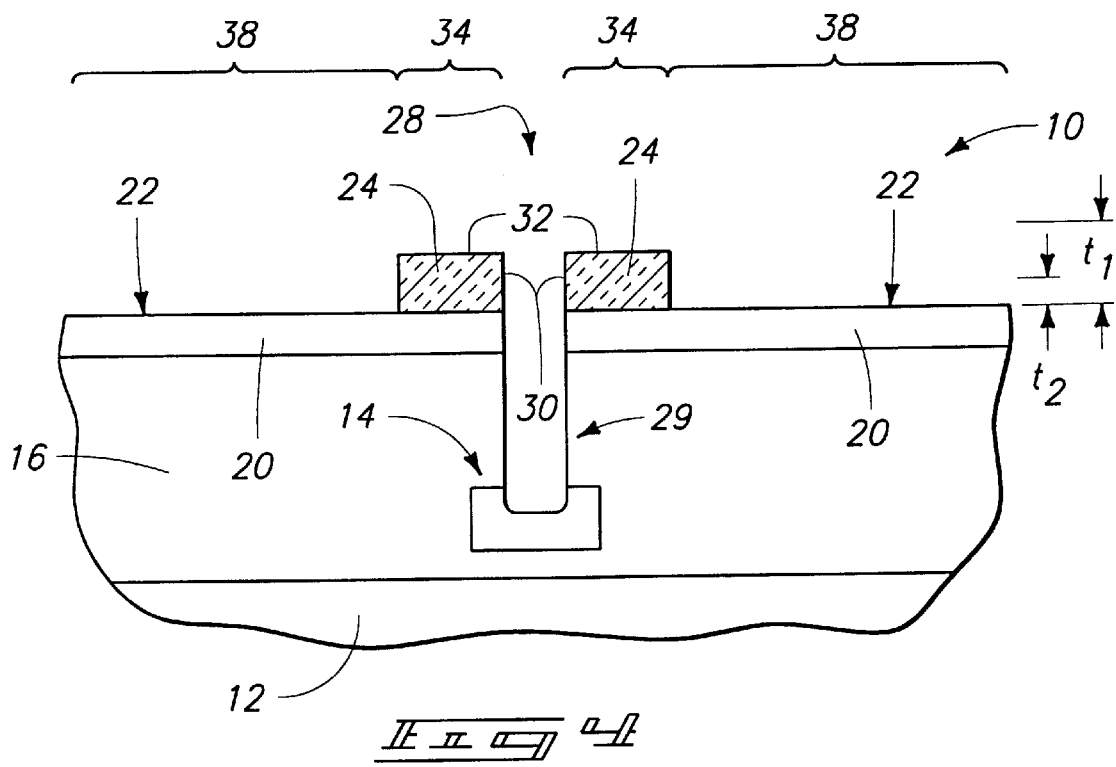

ns of this document, US 6,444,572 B2

SEMICONDUCTOR PROCESSING METHODS OF FORMING A CONTACT OPENING

This patent application is a continuation resulting from U.S. patent application Ser. No. 09/283,735, filed Apr. 1, 1999, now U.S. Pat. No. 6,274,482, issued Aug. 14, 2001, which is a continuation resulting from U.S. patent application Ser. No. 08/807,192, filed Feb. 27, 1997, now U.S. Pat. No. 5,985,766, issued Nov. 16, 1999.

TECHNICAL FIELD

This invention relates to semiconductor processing methods of forming a contact opening.

BACKGROUND OF THE INVENTION

Semiconductor fabrication typically involves forming conductive connections between substrate locations which are elevationally separated by one or more layers. To do so, portions of such layers must ordinarily be removed. Typically, such layer portions are removed by patterning and etching a contact opening through the overlying layers of material to expose an elevationally lower substrate location with which a conductive connection is desired. Such constitutes a first masking step in which a first mask is used to pattern the desired contact opening.

Subsequently, conductive material is formed within the contact opening to interconnect desired elevationally separated layers. Typically, following the interconnect step, the outermost elevationaly. separated layer is patterned and etched in a second masking step which. utilizes a second mask which is different from the first mask. Such might be the case when, for example, the outermost layer is patterned into a conductive line.

Accordingly, at least two separate masks are needed to respectively pattern two different layers of photoresist which are required to be formed at separate times over the substrate and at different processing points in the processing flow. It is desirable to reduce the number of processing steps which are required in a processing flow.

This invention grew out of concerns associated with simplifying semiconductor processing and reducing the number of processing steps which are required in a processing flow.

SUMMARY OF THE INVENTION

The invention provides methods of forming contact openings over a substrate to a substrate location with which electrical connection is desired. According to one aspect, a multi-level layer. comprising masking material is formed atop an electrically conductive substrate surface and defines a mask opening through which a,contact opening is to be formed to an elevationally lower substrate location. The masking material constitutes a single layer of photoresist which is patterned to form an elevationally thicker first layer immediately laterally adjacent the mask opening than a second layer which is formed laterally outward of the first layer. The electrically conductive substrate surface is etched through the mask opening to form the contact opening over the substrate location. The masking material second layer is then removed and the conductive substrate surface is etched to form at least a portion of an outer conductive component. Thereafter, conductive material is formed in the contact opening to electrically connect elevationally separated layers.

According to another aspect, a masking material layer is formed over a substrate outer surface and defines a pattern for a contact opening which is to be etched through the outer surface. In a preferred implementation, the masking material layer comprises a bi-level profile having two different layer elevational thicknesses, the greater of which being disposed immediately laterally adjacent the contact opening pattern. A contact opening is subsequently etched through the substrate outer surface to a substrate location. Conductive material is formed within the contact opening to electrically connect the substrate location with an outer layer.

In a preferred implementation, the masking material layer is photoresist formed through photolithography using only a single mask. In another implementation, more than one mask is used to define the multi-level or bi-level profile masking material layer. The multi-level masking layer can have more than two levels.

BRIEF DESCRIPTION OF THE DRAWINGS

Preferred embodiments of the invention are described below with reference to the following accompanying drawings.

FIG. 3 is a view of the FIG. 1 wafer at a processing step subsequent to that shown by FIG. 2.

FIG. 4 is a view of the FIG. 1 wafer at a processing step subsequent to that shown by FIG. 3.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
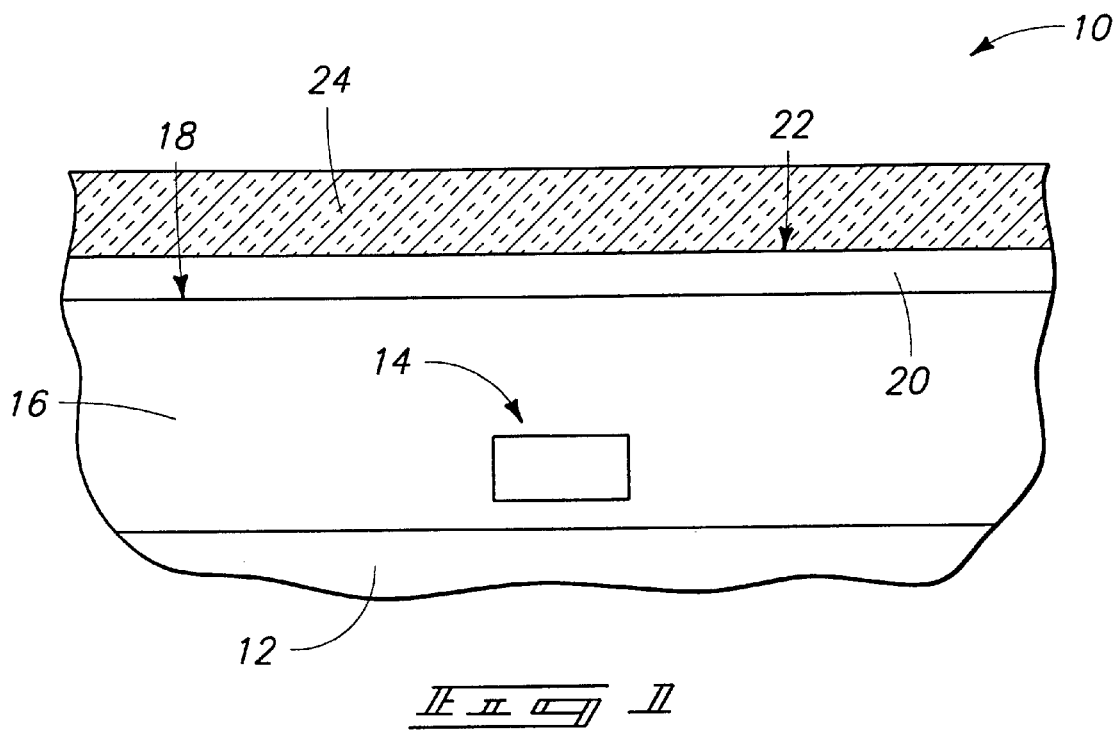
FIG. 1 is a diagrammatic sectional view of a semiconductor wafer fragment at one processing step in accordance with the invention.

Referring to FIG. 1, a semiconductor wafer fragment in process is indicated generally at 10. Such comprises a semiconductive substrate 12 which supports a plurality of layers described just below. In the context of this document, the term "semiconductive substrate" is defined to mean any construction comprising semiconductive material, including but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including but not limited to, the semiconductive substrates mentioned above.

A substrate location 14 is supported over substrate 12. Substrate location 14 constitutes an elevationally lower substrate location and can comprise any suitable substrate location with which electrical connection is desired. Accordingly, location 14 can comprise conductive material, a conductive line, a transistor gate line, or a source/drain diffusion region which constitutes part of a transistor construction, to name just a few. In the context of this discussion, however, and for exemplary purposes only, substrate location 14 is discussed in the context of a first layer comprising metal material which is formed over substrate 12, such as a conductive line.

A second layer 16 is formed over and relative to first layer 14. In the illustrated example, such constitutes an insulative dielectric material which is formed over and under first layer 14 for insulating the same. Second layer 16 defines a substrate surface 18. A third layer 20 is formed over substrate surface 18. In the illustrated example, third layer 20 comprises a conductive metal material. Accordingly, third layer 20 defines a conductive substrate surface 22. A layer 24 is formed over substrate surface 22 and preferably comprises a masking material, most preferably photoresist.

Figure 2:
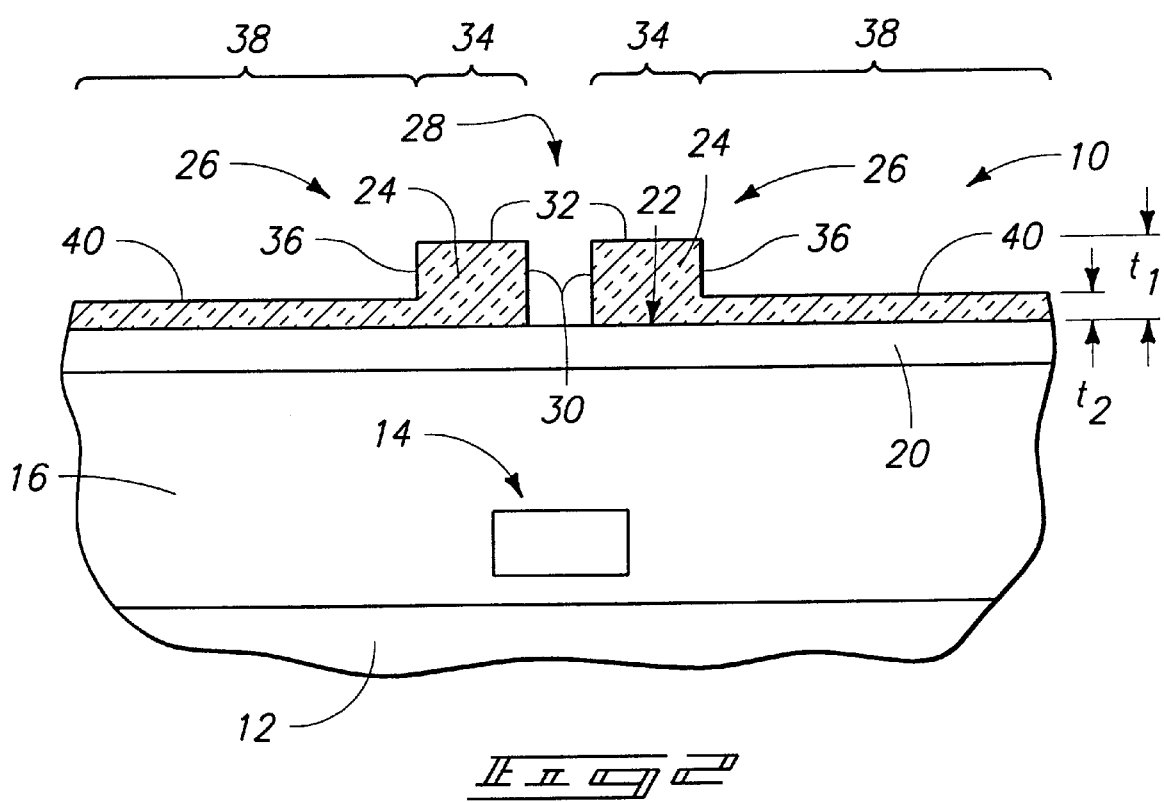
FIG. 2 is a view of the FIG. 1 wafer at a processing step subsequent to that shown by FIG. 1.

Referring to FIG. 2, photoresist layer 24 is exposed to conditions which are effective to define a masking layer 26 atop third layer 20. In the illustrated and preferred embodiment, masking layer 26 constitutes an integrally formed, multi-level layer of masking material which defines a mask opening or contact opening pattern 28. The preferred multi-level masking material layer 26 is characterized by an elevationally variable thickness relative to third layer 20. In a preferred implementation, an elevationally thicker first masking material layer (corresponding to $t_1$) is formed immediately laterally adjacent mask opening 28 than a second masking material layer (corresponding to $t_2$) which is formed laterally outward of or away from the first masking material layer. It will be understood that masking layer 26 can include transition areas between its different levels which are not necessarily vertically disposed, and that the individual levels which constitute the multi-level masking layer may not be substantially flat, as is shown. Although not specifically shown, masking layer 26 can be patterned to define other structures in addition to mask opening 28. Such other S structures can include conductive lines which are to be formed from layer 20 material. It will also be understood that masking layer 26 can include more than the two illustrated levels.

In the illustrated example, masking layer 26 constitutes a layer having a bi-level profile which is defined by two different layer elevational thicknesses, the greater of which ($t_1$) is disposed immediately laterally adjacent contact opening or masking layer opening 28. The illustrated masking layer opening 28 is defined, at least in part, by an inner masking layer wall 30 which extends a distance elevationally outward of conductive surface 22. Such distance corresponds to $t_1$.

A first masking layer level 32 is disposed adjacent inner masking layer wall 30. Accordingly, wall 30 terminates adjacent level 32. A laterally inner masking layer region is depicted by reference numeral 34. A laterally outward masking layer region is depicted by reference numeral 38. Region 34 is defined by the masking material which is disposed below level 32. Accordingly, region 34 extends laterally outward of inner masking layer wall 30. Region 34 includes an inner masking layer region outer surface, at least a portion of which coincides with and defines the first masking layer level 32. The first masking layer level 32 terminates adjacent an outer masking layer wall 36 which is joined with at least a portion thereof. Wall 36 extends elevationally downward from masking layer level 32 a distance which is less than the distance that the inner masking layer wall 30 extends outward of conductive surface 22.

Outer masking layer wall 36 terminates adjacent outer masking layer region 38. Region 38 is joined with and extends laterally away from or outward of outer masking layer wall 36. Region 38 includes an outer surface 40 which defines a second masking layer level which is elevationally lower than the first masking layer level 32.

In accordance with one implementation, the exposing of the photoresist layer comprises photolithography using a single mask for defining masking layer opening 28 and forming the illustrated photoresist construction. An exemplary mask which is suitable for use in such implementation is one which is characterized by different levels of light transmission. Such allows the subject photoresist to receive or be exposed to different levels of light at different locations. For example, a single mask suitable for use in rendering the FIG. 2 photoresist construction would have three different degrees of light transmission. That portion of the mask which overlies and corresponds to opening 28 would allow essentially all of the light to pass therethrough to fully expose all the thickness of the photoresist. That portion of the mask which corresponds to masking layer region 34 would essentially block all of the light so that the corresponding photoresist is not meaningfully exposed. That portion of the mask which corresponds to masking layer region 38 would essentially allow some of the light to pass therethrough so that some, but not all, of the photoresist thickness is exposed. Subsequent removal of the exposed photoresist would provide the FIG. 2 photoresist construction.

In accordance with another implementation, the FIG. 2 photoresist construction can be rendered through photolithography using more than one mask for defining masking layer opening 28. Either of the above described implementations constitute photolithographically exposing a single layer of photoresist.

Referring to FIG. 3, portions of conductive surface 22 are etched through mask opening 28 to at least partially, and preferably completely, form a contact opening 29 over substrate location 14 which outwardly exposes the same. In the illustrated example, portions of second layer 16 and third layer 20 which underlie conductive surface 22 are etched through the mask opening downwardly to substrate location 14. In one implementation, two etch chemistries can be utilized to form the subject contact opening. Accordingly, a first etch chemistry can etch layer 20 material selectively relative to layer 16 material. A second etch chemistry can etch layer 16 material selectively relative to layer 20 and layer 14 material. In the illustrated example, layer 20 and layer 14 constitute metal materials and layer 16 constitutes an insulative dielectric layer or oxide material. Accordingly, the first etch would etch the metal material comprising layer 20 selectively relative to the insulative dielectric layer, and the second etch would etch the dielectric insulative material selectively relative to the metal materials comprising layers 20 and 14. Other etch regimes are of course possible.

Referring to FIG. 4, at least some, and preferably all of the second masking material layer in region 38 is removed to outwardly expose corresponding portions of conductive surface 22. In a preferred implementation, such is accomplished utilizing a timed etch or etchback process. Accordingly, such leaves behind at least some of the first masking material layer in region 34 over associated underlying third layer material 20. Such etch can also etch into substrate location 14 as shown.

Figure 5:
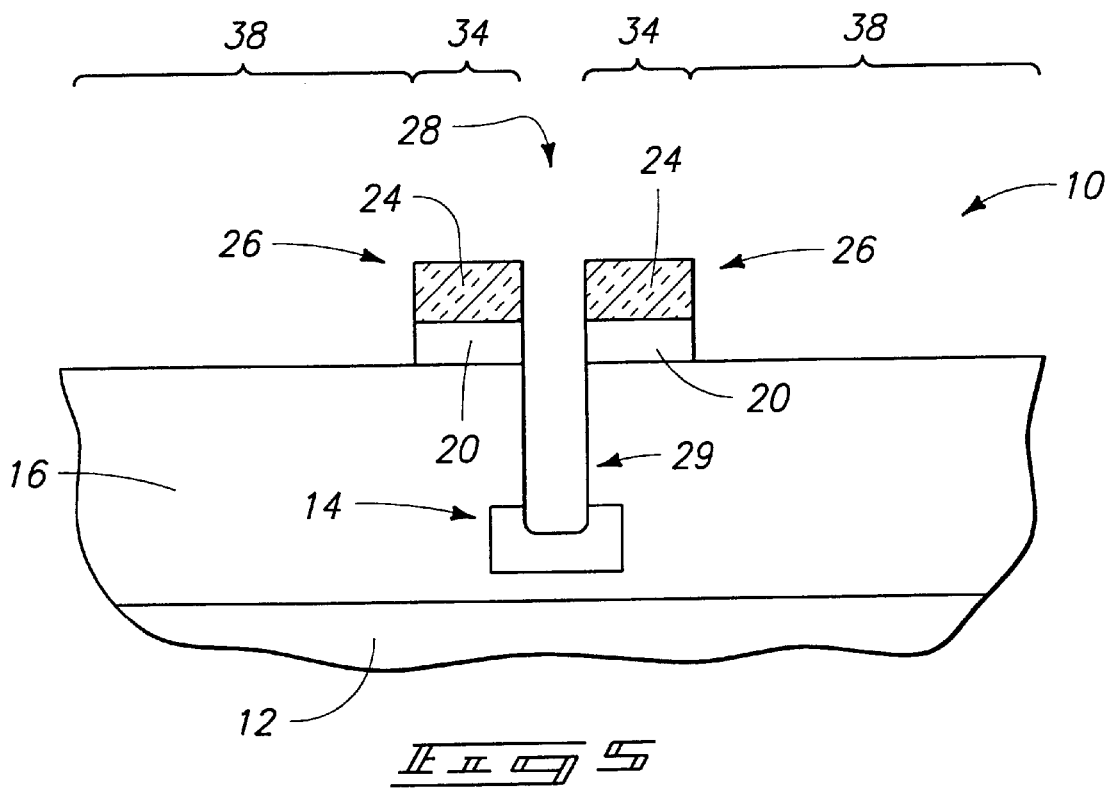
FIG. 5 is a view of the FIG. 1 wafer at a processing step subsequent to that shown by FIG. 4.

Referring to FIG. 5, exposed third layer 20 portions in region 38 are etched inwardly to outwardly expose second layer 16. Such constitutes etching portions of third layer 20 which are laterally outward of the contact opening while at least some of masking layer 26 remains in place. If layers 20 and 14 are different materials, then an etching process which etches layer 20 at a faster rate than layer 14 can be utilized. As an example, if layer 14 constitutes tungsten and layer 20 constitutes aluminum, then an etching process utilizing $BCl_3$ and $Cl_2$ will desirably etch tungsten at a very low rate relative to the aluminum. In addition, as layer 14 can be typically disposed at the bottom of a usually deep contact hole or opening, its resulting etch rate is or can be reduced accordingly. This is so, even in instances when the materials from which layers 14 and 20 are formed are the same material. In the illustrated example, portions of the masking layer which remain in place during removal of the laterally outward portions of layer 20 constitute those masking layer portions which are laterally closest to or proximate the contact opening. Subsequently, such remaining masking layer portions are removed to outwardly expose underlying portions of layer 20.

Figure 6:
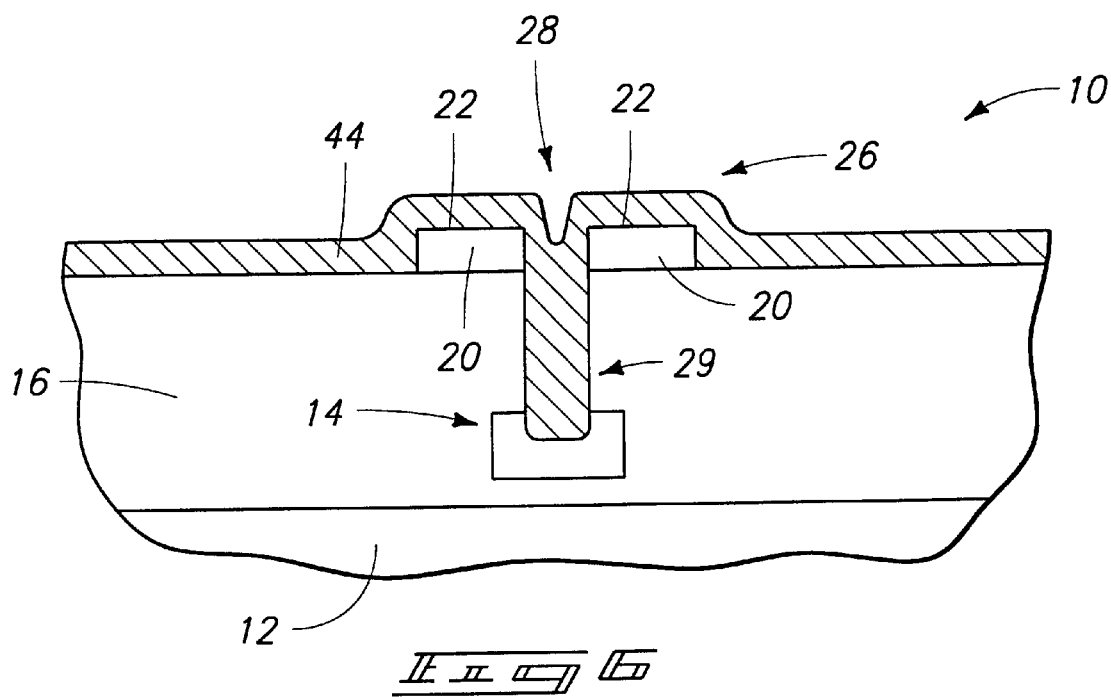
FIG. 6 is a view of the FIG. 1 wafer at a processing step subsequent to that shown by FIG. 5.

Referring to FIG. 6, a conductive material layer 44 is formed over the substrate, the exposed portions of layer 20, and to within contact opening 28 to interconnect substrate location or first layer 14 and third layer 20. Accordingly, electrical connection is made therebetween. An exemplary material for layer 44 is conductively doped polysilicon which is formed by chemical vapor deposition over the substrate. Accordingly, conductive layer 44 is formed over the remaining outer conductive surfaces 22 and the lower substrate location 14.

Figure 7:
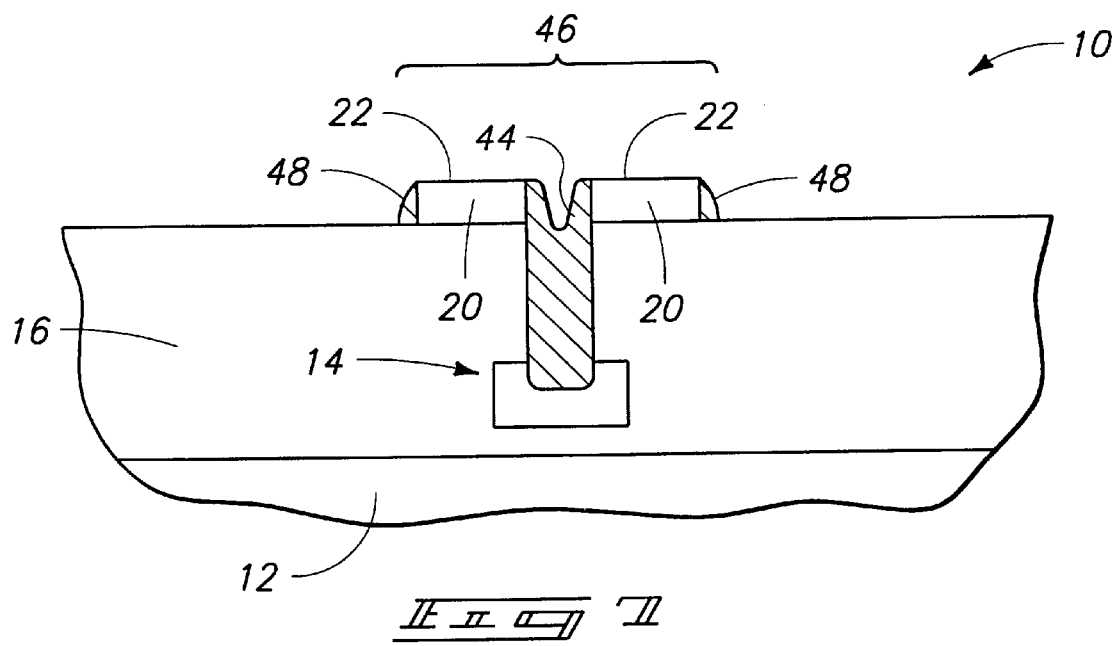
FIG. 7 is a view of the FIG. 1 wafer at a processing step subsequent to that shown by FIG. 6.

Referring to FIG. 7, conductive material layer 44 is etched laterally outward of third layer 20 to form an outer conductive component 46 which comprises at least some of third layer 20 and the outer conductive surface 22 thereof. Such outer conductive component can constitute a conductive line. In a preferred implementation, such etch is an anisotropic etch which is conducted laterally adjacent etched third layer portions in a manner which is sufficient to leave conductive spacers 48 over third layer 20.

Figure 8:
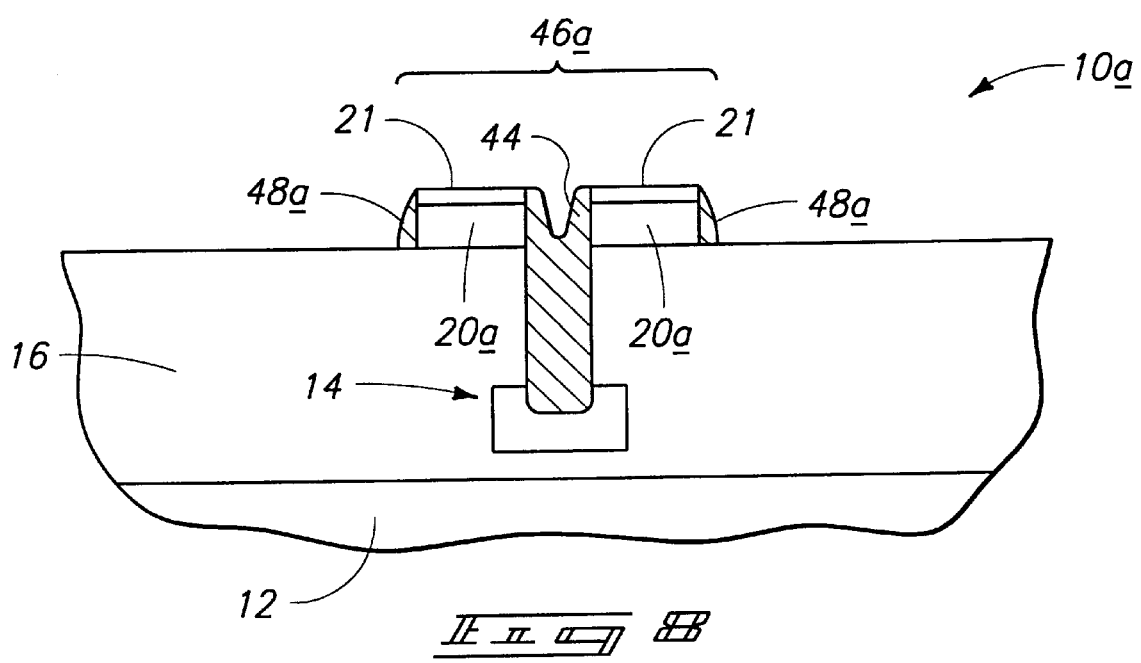
FIG. 8 is a view of a semiconductor wafer fragment in accordance with an alternate embodiment of the invention.

Referring to FIG. 8, an alternate embodiment is set forth. Like numbers from the first described embodiment are utilized where appropriate, with differences being indicated with the suffix "a" or with different numerals. Accordingly, outer conductive component 46a includes third layer 20a and a suitable conductive layer 21 thereatop. In the illustrated example, such conductive layer 21 can comprise a material such as TiN which might be utilized for barrier purposes or as an etch stop in connection with the etching of conductive material layer 44 to form component 46a. In the illustrated and preferred embodiment, layers 20a and 21 constitute different conductive layers.

As mentioned above, substrate location 14 can constitute any suitable substrate location with which electrical connection is made by removing one or more overlying material layers to form a contact opening thereto. For example, in the context of dynamic random access memory devices, such can be utilized to form one or more bit line contacts to transistor source/drain regions. Such can also be utilized to form a contact to an integrated circuitry landing pad.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method of forming an opening, comprising:

forming a multi-level layer comprising masking material atop an electrically conductive material, the multi-level layer defining a mask opening extending to and exposing the conductive material, the multi-level layer further comprising a thicker portion of masking material defining the mask opening relative a thinner portion of masking material immediately adjacent the thicker portion; and etching the electrically conductive material through the mask opening to form an opening which extends into the electrically conductive material.

2. The semiconductor processing method of claim 1 further comprising after the etching of the electrically conductive material, forming a second conductive material within the opening.

3. A semiconductor processing method of forming an opening comprising:

forming a masking layer over a substrate, the masking layer comprising a first exposed surface and a second exposed surface, the first exposed surface elevationally spaced a greater distance above the substrate relative to the elevationally spacing of the second exposed surface above the substrate; and etching through the first exposed surface of the masking layer to define a masking opening.

4. The semiconductor processing of claim 3, wherein the substrate comprises a conductive region formed therein, and further comprising extending the masking opening into the substrate to expose the conductive region.

5. The semiconductor processing of claim 4 further comprising:

removing portions of the masking layer to expose portions of the substrate; and forming a conductive material atop the exposed portions of the substrate and into the masking opening to contact the conductive region.

6. The semiconductor processing of claim 4 further comprising:

forming a conductive layer between the masking layer and the substrate wherein the masking opening extends through the conductive layer to define sidewalls in the conductive layer; and forming a conductive material within the masking opening to electrically connect the sidewalls of the conductive layer and the conductive region.

7. The semiconductor processing method of claim 4, wherein the conductive region comprises a conductive line.

8. The semiconductor processing method of claim 4, wherein conductive region comprises a source/drain diffusion region.

9. The semiconductor processing of claim 4 further comprising:

removing portions of the masking layer forming the second exposed surface to expose portions of the substrate; and forming a conductive material atop the exposed portions of the substrate and into the masking opening to contact the conductive region.

10. The semiconductor processing of claim 9, wherein the removing portions of the masking layer leaves only the masking layer forming the first exposed surface.

* * * * *

UNITED STATES PATENT AND TRADEMARK OFFICE
CERTIFICATE OF CORRECTION

PATENT NO.   : 6,444,572 B2
DATED        : September 3, 2002
INVENTOR(S)  : Zhiqiang Wu et al.

It is certified that error appears in the above-identified patent and that said Letters Patent is hereby corrected as shown below:

Column 3,
Line 38, replace "other S structures can include conductive lines which are to" with
-- other structures can include conductive lines which are to --

Signed and Sealed this

Twenty-ninth Day of July, 2003

JAMES E. ROGAN
*Director of the United States Patent and Trademark Office*